United States Patent
Sheedy et al.

(10) Patent No.: US 10,519,544 B2
(45) Date of Patent: Dec. 31, 2019

(54) METHOD FOR ENABLING OPTIMIZED MATERIAL DEPOSITION

(71) Applicant: United Technologies Corporation, Farmington, CT (US)

(72) Inventors: Paul Sheedy, Bolton, CT (US); Neal Magdefrau, Tolland, CT (US)

(73) Assignee: United Technologies Corporation, Farmington, CT (US)

( * ) Notice: Subject to any disclaimer, the term of this patent is extended or adjusted under 35 U.S.C. 154(b) by 8 days.

(21) Appl. No.: 15/685,830

(22) Filed: Aug. 24, 2017

(65) Prior Publication Data
US 2019/0062911 A1    Feb. 28, 2019

(51) Int. Cl.
| C23C 16/455 | (2006.01) |
| C23C 16/27 | (2006.01) |
| C23C 16/26 | (2006.01) |
| C23C 16/32 | (2006.01) |
| C23C 16/54 | (2006.01) |
| F01D 5/28 | (2006.01) |

(52) U.S. Cl.
CPC ........ *C23C 16/45527* (2013.01); *C23C 16/26* (2013.01); *C23C 16/27* (2013.01); *C23C 16/325* (2013.01); *C23C 16/45551* (2013.01); *C23C 16/45553* (2013.01); *C23C 16/45555* (2013.01); *C23C 16/45534* (2013.01); *C23C 16/545* (2013.01); *F01D 5/288* (2013.01); *F05D 2230/314* (2013.01)

(58) Field of Classification Search
CPC ........ C23C 16/45525; C23C 16/45548; C23C 16/45527; C23C 16/45551
See application file for complete search history.

(56) References Cited

U.S. PATENT DOCUMENTS

| 5,071,670 A | 12/1991 | Kelly |
| 6,099,976 A | 8/2000 | Lemelson et al. |
| 6,902,620 B1 * | 6/2005 | Omstead ........... C23C 16/45551 |
| | | 117/102 |

(Continued)

OTHER PUBLICATIONS

Yazdani, Nuri, et al., "Modeling and optimization of atomic layer deposition processes on vertically aligned carbon nanotubes". Beilstein J. Nanotechnol. 2014, 5, 234-244.*

(Continued)

*Primary Examiner* — Bret P Chen
(74) *Attorney, Agent, or Firm* — Kinney & Lange, P.A.

(57) ABSTRACT

A method for atomic layer deposition of high temperature materials from single source precursors includes placing a substrate in a reaction zone in gas isolation from other reaction zones and contacting the substrate in the reaction zone with a reactant to allow atoms in the reactant to combine with reaction sites on the substrate to form a layer of the reactant on the substrate. The substrate is then placed in a purge zone and purged with a flowing inert gas. The substrate is then placed in a final reaction zone in gas isolation from the other zones wherein the final reaction zone has an atmosphere and temperature to decompose adsorbed reactant and/or form desired phases with crystallinity to form a layer of material. The substrate is then placed in a purge zone and the process is repeated until a layer of material of desired thickness is formed on the substrate.

16 Claims, 2 Drawing Sheets

(56) References Cited

U.S. PATENT DOCUMENTS

| | | | |
|---|---|---|---|
| 8,202,366 B2* | 6/2012 | Dickey | C23C 16/545 |
| | | | 118/718 |
| 9,305,805 B2 | 4/2016 | Chang et al. | |
| 9,512,519 B2 | 12/2016 | Chuang et al. | |
| 2003/0194493 A1* | 10/2003 | Chang | C23C 16/45512 |
| | | | 427/248.1 |
| 2005/0158590 A1 | 7/2005 | Li | |
| 2006/0073276 A1* | 4/2006 | Antonissen | C23C 16/4412 |
| | | | 427/248.1 |
| 2006/0204666 A1* | 9/2006 | Buczek | C03C 1/008 |
| | | | 427/421.1 |
| 2008/0026162 A1 | 1/2008 | Dickey et al. | |
| 2012/0199952 A1* | 8/2012 | D'Evelyn | H01L 21/0237 |
| | | | 257/615 |
| 2012/0225194 A1 | 9/2012 | Yudovsky | |
| 2012/0321786 A1* | 12/2012 | Satitpunwaycha | |
| | | | C23C 16/45565 |
| | | | 427/252 |
| 2013/0001515 A1* | 1/2013 | Li | H01L 21/0242 |
| | | | 257/24 |
| 2013/0209685 A1* | 8/2013 | Ku | C23C 16/407 |
| | | | 427/255.26 |
| 2014/0113436 A1 | 4/2014 | Kato et al. | |
| 2016/0268107 A1* | 9/2016 | White | H01J 37/32899 |
| 2016/0314962 A1 | 10/2016 | Higashino et al. | |
| 2017/0029948 A1 | 2/2017 | Jongbloed et al. | |
| 2017/0032956 A1 | 2/2017 | Kawahara et al. | |
| 2017/0067156 A1* | 3/2017 | Leeser | C23C 16/4554 |
| 2017/0107621 A1* | 4/2017 | Suemori | H01J 37/32082 |
| 2017/0194156 A1 | 7/2017 | Fu et al. | |
| 2018/0182634 A1* | 6/2018 | Smith | H01J 37/32422 |
| 2019/0157054 A1* | 5/2019 | White | H01J 37/32899 |

OTHER PUBLICATIONS

Gordon, Roy G., et al., "A Kinetic Model for Step Coverage by Atomic Layer Deposition in Narrow Holes or Trenches". Chemical Vapor Deposition, 2003, 9, No. 2, pp. 73-78.*

Zazpe, Raul, et al., "Atomic Layer Deposition for Coating of High Aspect Ration TiO2 Nanotube Layers". Langmuir, 2016, 32, 10551-10558.*

Johnson, Richard W., et al., "A brief review of atomic layer deposition: from fundamentals to applications". Materials Today, vol. 17, No. 5, Jun. 2014, pp. 236-246.*

Extended European Search Report for EP Application No. 18190824.5, dated Feb. 12, 2019, 13 pages.

P. Poodt, et al., "Spatial Atomic Layer Deposition: A Route Towards Further Industrialization of Atomic Layer Deposition", from Journal of Vacuum Science and Technology: Part A, vol. 30, No. 1, 2012, pp. 010802-1-010802-11.

F. J. van den Bruele, et al., "Atmostpheric Pressure Plasma Enhanced Spatial ALD of Silver", from Journal of Vacuum Science and Technology: Part A, vol. 33, No. 1, 2014, pp. 01A131-1-01A131-6.

* cited by examiner

METHOD FOR ENABLING OPTIMIZED MATERIAL DEPOSITION

BACKGROUND

Atomic layer deposition (ALD) is a vapor phase technique capable of producing thin films of a variety of materials. Based on sequential, self-limiting reactions, ALD offers exceptional conformality on high aspect structures, thickness control at the Angstrom level, and tunable film composition. As a result ALD may be applicable for many industrial applications.

Atomic layer deposition (ALD) has been used in the semiconductor industry for a decade or more. The process works by first adsorbing a (mono) layer of a precursor on a surface of a sample, purging the excess precursor, and then introducing a second reactant which converts the adsorbed layer to the desired chemistry. This results in non-line of sight (NLOS) deposition of uniform, pinhole free, conformable, ultra-thin, coatings with low residual stress. The reaction conditions are chosen to achieve the best combination of precursor adsorption and subsequent reaction, with very low reaction temperatures (typically less than 700° C.) and a typical growth per cycle range of one Angstrom per cycle. Compositions can vary from metals to oxides, multilayer structures and even polymers via molecular layer deposition (MLD). Despite the extremely low deposition rates for well-known ALD coating process, such as for $Al_2O_3$, ALD can routinely deposit several tens of microns of material. Additionally, a methodology known as "spatial ALD" whereby the sample moves to different reaction zones (versus temporal ALD where the reactions are purged in/out of a chamber containing the sample) can allow for higher throughput and the opportunity for continuous ALD deposition. While many of the limitations of ALD regarding ultra-thin layers and slow processing are being addressed, non-semiconductor industrial applications of ALD are somewhat limited and remain more of an emerging area. ALD procedures and compositions for applications in modern aerospace technologies are needed.

SUMMARY

A method for atomic layer deposition from a single source precursor includes placing a substrate in a first reaction zone with a first atmosphere that is capable of being in gas isolation from a second reaction zone and a first purge zone and contacting the substrate in the first reaction zone with a reactant at a first temperature to allow atoms in the reactant to combine with reaction sites on the substrate to form a layer of the reactant on the substrate. The substrate is then passed through the first purge zone and purged with a flowing inert gas. This purge zone may also be at a second temperature. The substrate is then placed in a second reaction zone that is capable of being in gas isolation from the first reaction and first purge zones wherein the second reaction zone has a second atmosphere and a third temperature to decompose the adsorbed first reactant and/or form desired phases and crystallinity to form a layer of material. The substrate is then passed back through a second purge zone before being placed in the first reaction zone and the process repeated until a layer of material of desired thickness is formed on the substrate.

A method for atomic layer deposition includes (a) exposing a substrate to a single source precursor gas of an compound at a first temperature and a first pressure in a first chamber to form a single layer of the precursor adsorbed on the substrate, (b) transporting the substrate to a second chamber at a second temperature and a second pressure, (c) purging the second chamber with an inert gas to remove unadsorbed precursor, (d) transporting the substrate to a third chamber, (e) heating the substrate at a third temperature and a third pressure in an inert or reactive atmosphere to decompose the precursor to desired amorphous or crystalline forms of a new material on the substrate, (f) transporting the substrate to the second chamber, (g) purging the second chamber with an inert gas to remove unreacted precursor and loose reactant, (h) transporting the substrate to the first chamber, and (i) repeating steps a to e until a layer of the compound with a desired thickness is formed.

DETAILED DESCRIPTION

In general ALD consists of sequential alternating pulses of gaseous chemical precursors that react with a substrate. These individual gas surface reactions are called 'half reactions' and make up only part of the materials synthesis. During each half reaction, precursor gas is pulsed into a chamber, typically under low pressure (less than 1 Torr), for a designated amount of time to allow the precursor to fully react with the substrate surface feature through a self-limiting process that leaves no more than a single monolayer at the surface. Subsequently, the chamber may be purged with an inert gas to remove any unreacted precursor or precursor byproducts. This is then followed by a pulse of a counter reactant creating one layer of the desired material. After a purge to remove any counter reactant or byproducts, the entire process is then cycled until the required layer thickness is achieved. Typically ALD processes are conducted at temperatures of less than 700° C. The temperature range where the growth is saturated depends on each ALD process and is referred to as an "ALD temperature window". Temperatures outside the window generally result in poor growth rates and non-ALD type deposition due to effects such as slow reaction kinetics, precursor condensation (at low temperatures) and thermal decomposition or rapid desorption of the precursor (at high temperatures). It is desirable to operate within the designated ALD window for each deposition process.

The primary disadvantage of ALD processes is the slow build-up of extremely thin, often amorphous coatings. Most spatial ALD processes are first developed using a "temporal" ALD setup with determination of preferred reaction parameters such as temperature of adsorption and reaction, which are then transferred to a spatial process. The temperatures of temporal ALD processes are fixed for both half reactions since a single chamber is used. The temperatures and other parameters are typically chosen to result in the desired growth per cycle by balancing competing processes with precursor adsorption, decomposition and reaction with the subsequent reactant. This often leads to non-optimal parameters for each half reaction as the process temperature chosen is a compromise between the two half reactions. In spatial ALD, with reactants separated in different reaction zones for precursor adsorption and/or reaction, this constraint does not exist which may allow for optimization of the temperature for competing processes. By separating temperatures in separate reaction zones, ALD via single source precursors, which previously could not be utilized due to the inability to separate reactants in a temporal setup, could now also be conducted by separating the temperatures of adsorption of the precursor and the decomposition of the precursor. Single source ALD is the focus of the present disclosure.

Figure 1:
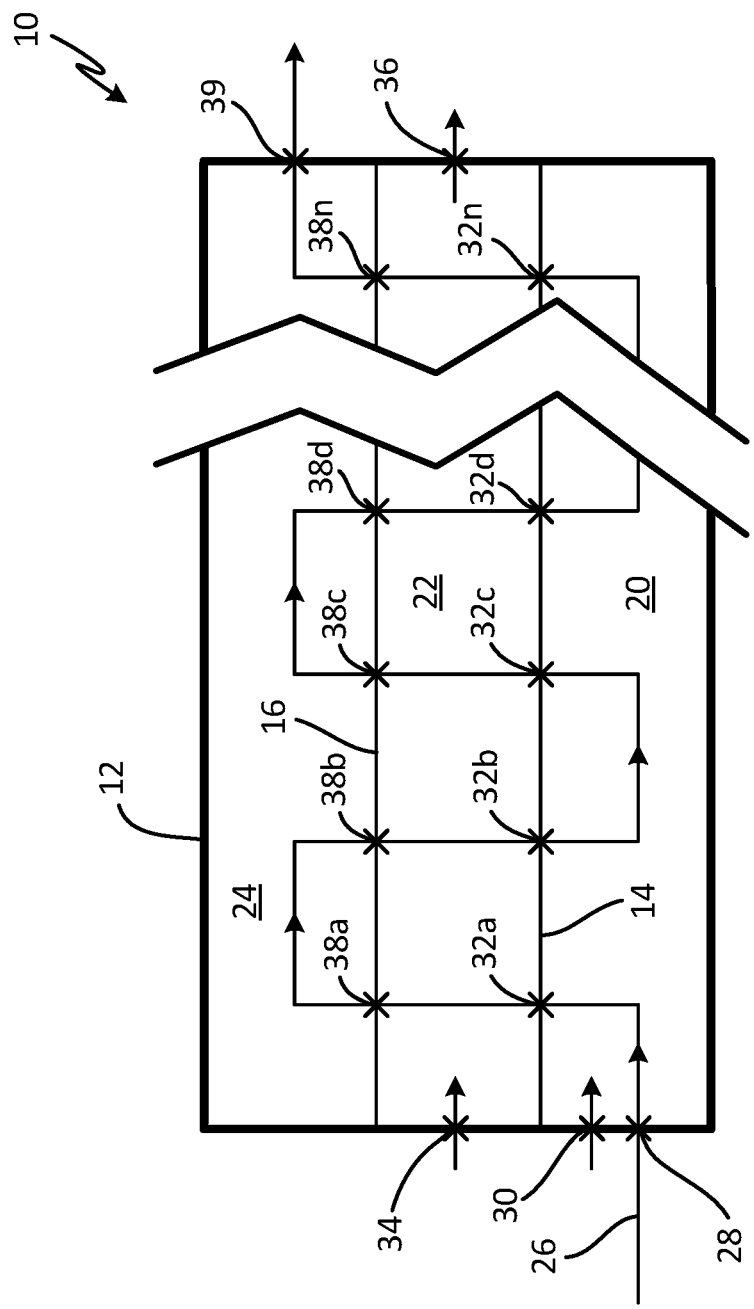
FIG. 1 is a schematic diagram illustrating a single precursor atomic layer deposition reactor.

A schematic of such a spatial reactor wherein the temperatures of separate reaction zones are separated and may be different is shown in FIG. 1. FIG. 1 is a schematic diagram showing the passage of a substrate through a spatial ALD reactor containing at least 3 reaction zones isolated from each other by valve or airlock features to prevent cross communication of reactor gases as the substrate passes through the reactor in an ALD deposition process.

ALD reactor 10 comprises outer container 12 with internal dividing walls 14 and 16, reaction zone chamber 20, purge zone chamber 22, and reaction zone chamber 24 each with access to separate sources (not shown) of reactant and other, inert, and reactive gases. Passage of a substrate (not shown) through reactor 10 in an atomic layer deposition process of the present disclosure is schematically indicated by path 26. In an exemplary ALD deposition process, a substrate enters reaction zone chamber 20 in reactor 10 through valve or airlock (hereafter called passage) 28. Reactant gas enters reaction zone chamber 20 through passage 30 and is adsorbed on a substrate after a predetermined time. The temperature and pressure of reaction zone chamber 20 are maintained at predetermined levels by means known in the art. In an embodiment, the pressure in reaction zone chamber 20 is less than about 1 Torr. The process is continued by transferring the substrate into purge zone chamber 22 through passage 32a. The substrate containing an adsorbed layer of reactant is subjected to a purge of flowing inert carrier gas that enters purge zone chamber 22 through passage 34 and exits purge zone chamber 22 through passage 36. The purge removes everything except a single layer of reactant adsorbed on the substrate. The temperature of purge zone chamber 22 may be maintained at a gradient between the temperature of reaction zone chamber 20 and reaction zone chamber 24.

In the next step the substrate is transferred to reaction zone chamber 24 through passage 38a. The temperature, pressure, and atmosphere of reaction zone chamber 24, in an embodiment, may be optimized for decomposition of adsorbed precursor to form a stable ALD film of decomposed and transformed precursor that may be different from those in the previous reaction and purge chambers.

In the next step, the substrate may be transferred back into purge zone chamber 22 through passage 38b where residues of the decomposition of the adsorbed precursor are removed by flowing inert carrier gas through purge zone chamber 22. In the illustrated embodiment, the substrate is transferred back into the same purge zone chamber 22, although in alternate embodiments, the substrate may be transferred to an additional, separate purge zone (not shown). The substrate now contains a monolayer of a material formed by atomic layer deposition. Continuing the process, the substrate is transferred back into reaction zone chamber 20 through passage 32b and exposed to the initial reactant at the appropriate time, temperature, and pressure where a monolayer of reactant is adsorbed on the initial ALD layer on the substrate.

Following the formation of the second layer of adsorbed reactant, the substrate is transferred to purge zone chamber 22 through passage 32c where residual unadsorbed reactant molecules are removed by flowing inert carrier gas through purge zone chamber 22. The substrate is then transferred to reaction zone chamber 24 through passage 38c where the conditions are optimized to decompose the adsorbed precursor to form a second stable ALD film of decomposed and transformed precursor on the first ALD layer of decomposed and transformed precursor. The substrate is then transferred back into purge zone chamber 22 through passage 38d where residue of decomposed and transformed precursor is removed. The substrate is then transferred to reaction zone chamber 20 through passage 32d and exposed to initial reactant gas at the appropriate time, temperature, and pressure until a monolayer of reactant forms on the second ALD layer on the substrate.

The above process is continued until an ALD layer of decomposed precursor of appropriate thickness is produced. At this point the substrate exits reactor 10 through passage 39.

The above process is an atomic layer deposition wherein a single source precursor is employed to form a layer. Non-limiting examples of ALD from single source precursors are carbon from methane or kerosene, and silicon carbide from disilacyclobutane or heterocyclic silanes such as silacyclobutanes, pentanes or hexanes.

In the previous discussion of a single source precursor ALD, the temperature of reaction zone chamber 20 was optimized for adsorption of a precursor on the substrate. Transferring the substrate into purge zone chamber 22 from reaction zone chamber 20 then removes the unadsorbed reaction products as well as any reactant byproducts by purging with inert carrier gas at an appropriate temperature in purge zone chamber 22 before transferring the substrate into reaction zone chamber 24. In this embodiment, the temperature of reaction zone chamber 24 may be optimized such that the decomposed reactant may crystallize or may undergo other phase transformations, and the temperature of reaction zone chamber 24 may be up to 2000° C.

Figure 2:
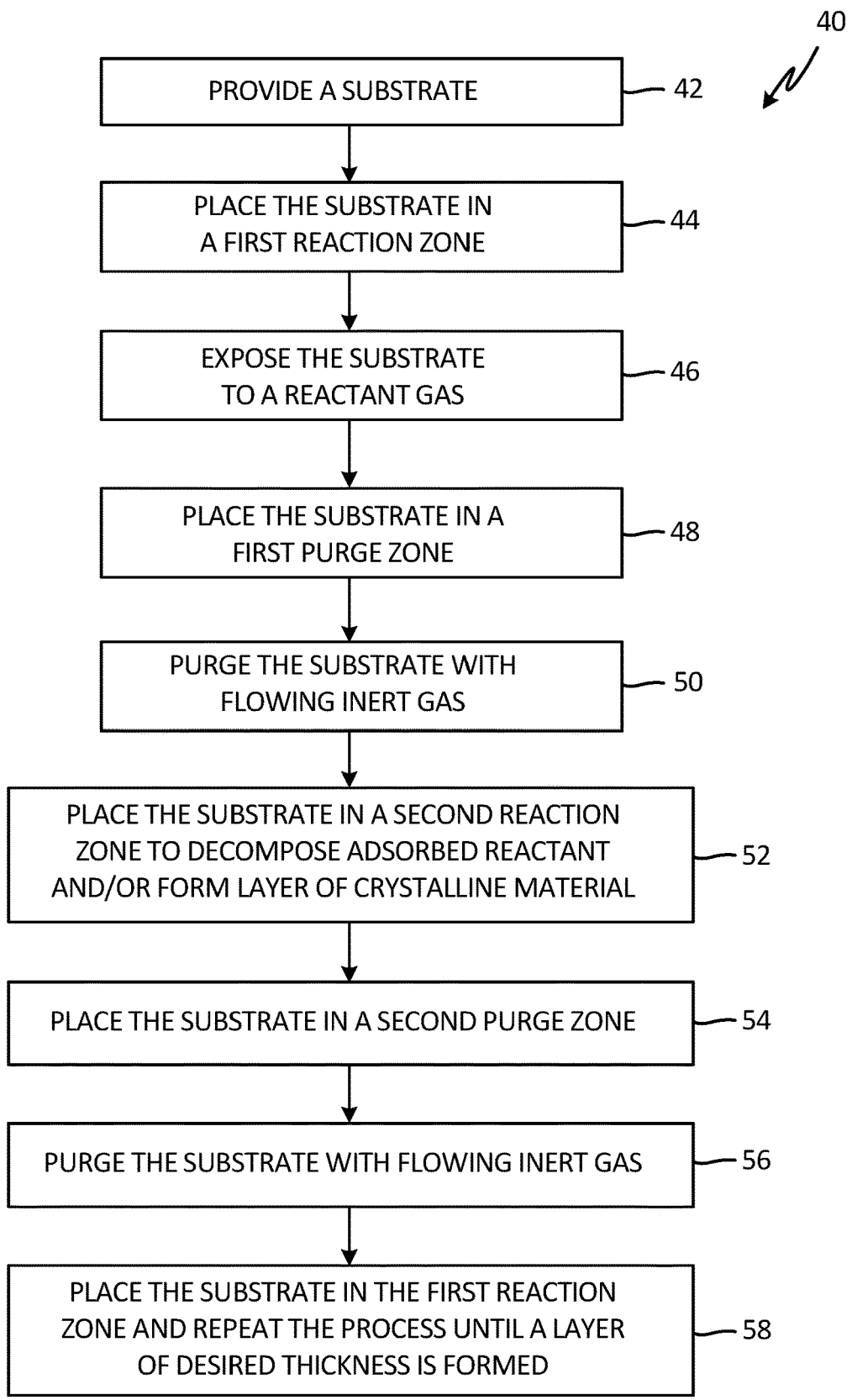
FIG. 2 is a diagram of a single precursor atomic layer deposition process.

A method to form an ALD coating according to the present disclosure is shown in FIG. 2. Method 40 begins by providing a substrate at step 42. The substrate may have any physical form because the ALD coating process is general and non-line of sight. The substrate may then be placed in a reaction zone that is gas isolated from its surroundings and has means of controlling the temperature and pressure of the reaction zone at step 44. The substrate may then be exposed to a reactant gas that may interact with the substrate by chemically adsorbing to reaction sites on the substrate surface to form a monolayer of an adsorbed species on the surface at step 46. The layer may be extremely smooth because the coating process is self-limiting and no uncoated surface sites are left behind. The temperature and pressure of the reaction zone may affect the kinetics of the adsorption process. The temperature of the first reaction zone may be from room temperature to 500° C. A vacuum of less than 1 Torr is standard, although other pressures may be used. Higher temperatures may decompose the adsorbed reactants into acceptable different chemical forms.

At step 48, the substrate may be placed in a first purge zone at a prescribed pressure and temperature. For example, atmospheric pressure may be applied here. The temperature of the purge zone may be the same as that in the first reaction zone or the temperature may be higher than the first reaction zone and may be up to 700° C. In this purge zone, the substrate may be purged with flowing inert gas to eliminate unadsorbed reactant and reaction byproducts at step 50.

The substrate may then be placed in a second reaction zone at a temperature to thermally decompose adsorbed reactant. The temperature and atmosphere in the second reaction zone may also be sufficient to transform the adsorbed reactant into a crystalline or other form of material at step 52. The temperature of the third reaction zone may be from 500° C. to 2000° C. (e.g., 501° C. to 2000° C.).

Substrate may then be placed in a second purge zone to remove unreacted reactant and other unattached transformation products at step 54. In an embodiment, during purging at step 56 the temperature may be from room temperature to 700° C. under flowing argon at atmospheric pressure. Following purging, the substrate may be returned to the first reaction zone and the process repeated until a layer of desired thickness is formed in step 58.

Single source precursors for SiC, may include heterocyclic silanes including silacyclobutanes, pentane or hexanes. The resulting coatings may be amorphous SiC or crystalline forms of SiC such as alpha SiC and/or beta SiC, and combinations thereof.

Single source precursors of various forms of carbon such as amorphous carbon, graphene, diamond or other forms may include alkane gases such as methane, ethane, natural gas, pentane, and/or hexane. Other single source precursors include cycloalkanes, for example, cyclopentane or cyclohexane; aromatic hydrocarbons, for example, benzene; polycyclic aromatic hydrocarbons, for example naphthalene; and/or other heterocyclic compounds.

These are not limiting examples and numerous carbides, nitrides, oxides, elemental compounds, and combinations known and not known in the art may be formed from single source precursors using the methods of the present disclosure.

Discussion of Possible Embodiments

The following are non-exclusive descriptions of possible embodiments of the present invention.

A method for atomic layer deposition includes placing a substrate in a first reaction zone with a first temperature at a first pressure and a first atmosphere that is capable of being in gas isolation from a first purge and a second reaction zone and contacting the substrate in the first reaction zone with a first reactant at a first temperature to allow atoms in the reactant to combine with reaction sites on the substrate to form a first layer of the reactant on the substrate. The method continues by placing the substrate in the first purge zone that is configured to be in gas isolation from the first and second reaction zones and purging the substrate in the first purge zone with flowing inert gas at a second pressure and second temperature. The method further includes placing the substrate in the second reaction zone that is configured to be in gas isolation from first reaction zone and first purge zone wherein the second reaction zone has a third atmosphere and a third temperature to decompose adsorbed first reactant and/or form desired phases and/or crystallinity to form a first layer of new material. The method continues by placing the substrate in a purge zone and purging substrate in the purge zone with flowing inert gas at a second pressure and second temperature before placing the substrate in a reaction zone with a first atmosphere, first reactant, and first temperature and repeating the process until a layer of new material of desired thickness if formed on the substrate.

The method of the preceding paragraph can optionally include, additional and/or alternatively any one or more of the following features, configurations and/or additional components:

The first reactant may be a single source reactant.

The single source reactant may be selected from a group consisting of methanes, pentanes, hexanes, kerosene, heterocyclic silanes, alkane gases, cycloalkanes, polycyclic aromatic hydrocarbons, and other heterocyclic compounds.

The new material may be one of various forms of carbon selected from a group consisting of amorphous carbon, graphene, diamond, various forms of SiC including amorphous SiC, alpha SiC, and/or beta SiC, and combinations thereof.

The first pressure may be less than 1 Torr.

The first temperature may be from room temperature to 500° C.

The second temperature may be from room temperature to 700° C.

The third temperature may be from 500° C. to 2000° C.

The inert gas may be argon.

The first and second reaction zones and first purge zone may occupy the same chamber or separate isolated chambers.

The substrate may be an inorganic or organic substrate.

The substrate may be a turbine engine component.

A method for atomic layer deposition includes exposing a substrate to a single source precursor gas of a compound at a first temperature and a first pressure in a first chamber to form a single layer of the precursor adsorbed on the substrate. The method continues by transporting the substrate to a second chamber at a second temperature and a second pressure and purging the second chamber with an inert gas to remove unadsorbed precursor. The method continues by transporting the substrate to a third chamber and heating the substrate in an inert or reactive atmosphere at a third temperature and third pressure to decompose the precursor to desired amorphous or crystalline forms of a new material on the substrate. The method continues by transporting the substrate to the second chamber and purging the second chamber with an inert gas as to remove unreacted precursor and loose reactant before transporting the substrate to the first chamber where the above steps are repeated until a desired thickness of new material is formed on the substrate.

The method of the preceding paragraph can optionally include, additionally and/or alternatively, any one or more of the following features, configurations, and/or additional components:

The single source precursor may be selected from a group consisting of methanes, pentanes, hexanes, kerosene, heterocyclic silanes, alkane gases, cycloalkanes, polycyclic aromatic hydrocarbons, and other heterocyclic compounds.

The new material may be one of various forms of carbon selected from a group consisting of including amorphous carbon, graphene, diamond, various forms of SiC including amorphous SiC, alpha SiC, and/or beta SiC, and combinations thereof.

The first temperature may be from room temperature to 500° C.

The third temperature may be from 500° C. to 2000° C.

The second temperature may be between the first and third temperatures.

The first pressure may be a pressure less than 1 Torr.

The third temperature may be from 500° C. to 2000° C.

The invention claimed is:

1. A method for atomic layer deposition comprising:
   placing a substrate in a first reaction zone with a first temperature and a first pressure and a first atmosphere that is capable of being in gas isolation from a first purge zone and a second reaction zone;
   contacting the substrate in the first reaction zone with a first reactant at the first temperature to allow atoms in the reactant to combine with reaction sites on the substrate to form a first layer of the reactant on the substrate, wherein the first reactant is a single source reactant;

placing the substrate in the first purge zone that is configured to be in gas isolation from the first reaction zone and the second reaction zone such that communication of gas between the first purge zone and the reaction zone and the second reaction zone is prevented;

purging the substrate in the first purge zone with flowing an inert gas at a second pressure and a second temperature;

placing the substrate in the second reaction zone that is configured to be in gas isolation from the first reaction zone and the first purge zone, wherein the second reaction zone is isolated from the first reaction zone and the first purge zone by a valve operable to prevent communication of gas, wherein the second reaction zone has a third atmosphere and a third temperature to decompose and crystalize the adsorbed first reactant to form a first layer of new material, wherein the third temperature is from 501° C. to 2000° C.;

placing the substrate in a second purge zone;

purging the substrate in the second purge zone with flowing the inert gas at the second pressure and the second temperature; and placing the substrate in the first reaction zone with the first atmosphere, the first reactant, and the first temperature and repeating the method until a layer of material of desired thickness is formed on the substrate, wherein the substrate is exposed to the single source reactant and no other reactants during the method.

2. The method of claim 1 wherein the single source reactant is selected from a group consisting of methanes, pentanes, hexanes, kerosene, heterocyclic silanes, alkane gases, cycloalkanes, polyclic aromatic hydrocarbons, and other heterocyclic compounds.

3. The method of claim 1 wherein the new material comprises one of various forms of carbon selected from a group consisting of amorphous carbon, graphene, diamond, various forms of SiC including amorphous SiC, alpha SiC, and/or beta SiC, and combinations thereof.

4. The method of claim 1 wherein the first pressure is less than 1 Torr.

5. The method of claim 1 wherein the first temperature is from room temperature to 500° C.

6. The method of claim 1 wherein the second temperature is from room temperature to 700° C.

7. The method of claim 1 wherein the inert gas is argon.

8. The method of claim 1 wherein the first and second reaction zones and the first purge zone occupy the same chamber.

9. The method of claim 1 wherein the substrate comprises an organic substrate.

10. The method of claim 1 wherein the substrate is a turbine engine component.

11. A method for atomic layer deposition comprising:
a. exposing a substrate to a single source precursor gas of a compound at a first temperature and a first pressure in a first chamber to form a single layer of the precursor adsorbed on the substrate;
b. transporting the substrate to a second chamber at a second temperature and a second pressure and isolating the second chamber from the first chamber such that communication of gas between the first chamber and the second chamber is prevented;
c. purging the second chamber with an inert gas to remove unadsorbed precursor;
d. transporting the substrate to a third chamber and isolating the third chamber from the second chamber such that communication of gas between the second chamber and the third chamber is prevented;
e. heating the substrate in an inert or reactive atmosphere at a third temperature and third pressure to decompose and crystalize the precursor into a new material on the substrate, wherein the third temperature is from 501° C. to 2000° C.;
f. transporting the substrate to the second chamber;
g. purging the second chamber with an inert gas to remove unreacted precursor and loose reactant;
h. transporting the substrate to the first chamber;
i. repeating steps a to h until a desired thickness of new material is formed, wherein the substrate is exposed to the single source precursor gas and no other precursor gas during the method.

12. The method of claim 11 wherein the single source precursor is selected from a group consisting of methanes, pentanes, hexanes, kerosene, heterocyclic silanes, alkane gases, cycloalkanes, polyclic aromatic hydrocarbons, and other heterocyclic compounds.

13. The method of claim 11 wherein the new material comprises one of various forms of carbon selected from a group consisting of amorphous carbon, graphene, diamond, various forms of SiC including amorphous SiC, alpha SiC, and/or beta SiC, and combinations thereof.

14. The method of claim 11 wherein the first temperature is from room temperature to 500° C.

15. The method of claim 11 wherein the second temperature is from room temperature to 700° C.

16. The method of claim 11 wherein the first pressure comprises a pressure less than 1 Torr.

* * * * *